United States Patent

Miyamoto et al.

[11] Patent Number: 5,169,478
[45] Date of Patent: Dec. 8, 1992

[54] APPARATUS FOR MANUFACTURING SEMICONDUCTOR DEVICES

[75] Inventors: Hidekazu Miyamoto, Sagamihara; Kojiro Sugane, Kashiwa; Noritsugu Yamada, Ichikawa, all of Japan

[73] Assignee: Friendtech Laboratory, Ltd., Kawasaki, Japan

[21] Appl. No.: 611,386

[22] Filed: Nov. 9, 1990

Related U.S. Application Data

[63] Continuation of Ser. No. 368,993, Jun. 16, 1989, abandoned, which is a continuation of Ser. No. 205,602, Jun. 10, 1988, abandoned, which is a continuation of Ser. No. 108,508, Oct. 8, 1987, abandoned.

[51] Int. Cl.$^5$ .................. C23C 14/00; H01L 21/00
[52] U.S. Cl. .................... 156/345; 156/643; 118/725; 118/730
[58] Field of Search .......... 156/345, 643, 639; 118/725, 730; 204/298.06, 298.07, 298.08, 298.09, 298.28, 298.33, 298.34

[56] References Cited

U.S. PATENT DOCUMENTS

| | | | |
|---|---|---|---|
| 3,460,510 | 8/1969 | Currin | 118/725 X |
| 3,704,987 | 12/1972 | Arndt et al. | 118/725 |
| 4,263,872 | 4/1981 | Ban | 118/730 |
| 4,303,467 | 12/1981 | Scornavacca et al. | 156/345 |
| 4,405,435 | 9/1983 | Tateishi et al. | 204/298 |
| 4,446,817 | 5/1984 | Crawley | 118/725 |
| 4,501,766 | 2/1985 | Suzuki et al. | 118/730 |
| 4,526,644 | 7/1985 | Fujiyama et al. | 156/345 |
| 4,526,805 | 7/1985 | Yoshizawa | 118/730 |
| 4,529,474 | 7/1985 | Fujiyama et al. | 156/345 |
| 4,539,933 | 9/1985 | Campbell et al. | 118/725 X |
| 4,545,327 | 10/1985 | Campbell et al. | 118/725 X |
| 4,569,719 | 2/1986 | Coleman | 156/345 |
| 4,612,207 | 9/1986 | Jansen | 118/730 |
| 4,615,299 | 10/1986 | Matsuyama et al. | 118/730 |
| 4,624,738 | 11/1986 | Westfall et al. | 156/902 |
| 4,638,762 | 1/1987 | Kim et al. | 118/730 |
| 4,640,223 | 2/1987 | Dozier | 118/730 |
| 4,694,779 | 9/1987 | Hammond et al. | 156/345 |
| 4,707,210 | 11/1987 | Misumi | 156/345 |
| 4,760,244 | 7/1988 | Hokynar | 118/725 X |

Primary Examiner—Thi Dang
Attorney, Agent, or Firm—Armstrong, Nikaido, Marmelstein, Kubovcik & Murray

[57] ABSTRACT

A thermal reactor for processing semiconductor wafers includes a ring-like reactor body having a cylindrical outer surface and having a central depressed portion to define an inner circular space at the cross section of the reactor body along a longitudinal direction of the reactor body. A wafer holder for mounting the wafers vertically is positioned within the inner circular space and is rotated when a reaction gas is passed from an open bottom end of the reactor body toward a top end of the reactor body. The reaction gas is exhausted through a conduit placed along the outer surface of the reactor body. A plurality of plasma generating electrodes are positioned around the outer surface and within the central depressed portion of the reactor body in order to clean an inner side wall of the reactor body.

5 Claims, 7 Drawing Sheets

APPARATUS FOR MANUFACTURING SEMICONDUCTOR DEVICES

This application is a continuation of application Ser. No. 368,993 filed Jun. 16, 1989, abandoned which is a continuation of application Ser. No. 205,602, filed Jun. 10, 1988, now abandoned, which is a continuation of application Ser. No. 108,508, filed Oct. 8, 1987, now abandoned.

BACKGROUND OF THE INVENTION

1. Field of the Invention

This invention relates to an apparatus for manufacturing semiconductor devices. More specifically, this invention relates to an apparatus for thermal processing semiconductor wafers within a vertical furnace.

2. Description of the Related Art

In manufacture of semiconductor devices, a plurality of thermal processings are carried out. Examples are thermal oxidation, diffusion chemical vapor deposition and chemical vapor etching. These processings were conventionally carried out by using a horizontal quartz tube. In the horizontal quartz tube, it affords high output of production. In other words, a plurality of semiconductor wafers are processed at once. However, there is a trend to use wafers having larger size. Therefore, the quartz tube has to have large diametric size. This arises one difficulty for maintaining equal temperature distribution in a vertical direction to the horizontal tube. Normally, the upper portion of the tube has slightly higher temperature. Furthermore, large size wafers means increase of total weight of the boat which mounts the such large size wafers. This also arises another difficulty for insertion and drawing back of the boat. Conventionally, a quartz bar is attached to the boat and this bar is handled for the working. The bar tends to bend because of the increased weight of the boat.

Recently, a vertical reactor is also used for saving floor space. In order to install a large number of wafers, the height of the vertical reactor is increased. However, there is a limitation of ceiling of the clean room and this limits the number of wafers which can be set within the vertical reactor.

One example of the vertical reactor is disclosed in U.S. Pat. No. 4,062,318 wherein each wafer is mounted on each surface of carbon susceptors. The vertical reactors are now manufactured by U.S. and foreign makers.

In a U.S. application of Ser. No. 017,693 assigned to the same assignee of the present application, another example of vertical reactor having a plurality of plasma cleaning electrodes is disclosed.

Other examples of reactors are shown in Japanese Laid-Open patent publications 59(1984)-145531 and 54(1979)-56366. These publications disclose mainly plasma CVD apparatus in which wafers are vertically mounted on a wafer holder within a cylindrical reactor body. Top view of the wafers is spoke-like fashion. Reaction gases are fed at center of the cylindrical reactor. Heat is provided by a lamp provided outside the reactor.

SUMMARY OF THE INVENTION

It is an object of the present invention is to provide a vertical thermal reactor having ring-like reactor body for establishing equal temperature distribution to a plurality of semiconductor wafers.

Another object of the present invention is to provide a vertical thermal reactor having self-cleaning plasma electrodes.

Other object of the present invention is to provide a ring-like reactor with a gas outlet at top end thereof.

According to the present invention, a ring-like reactor body is used for arranging a plurality of semiconductor wafers vertically. Top view of the wafers within the ring-like reactor is spoke-like. The wafer ring is mounted on a wafer holder. Another wafer holder can be used so as to stack on the wafer holder for setting more wafers within the ring-like reactor. The wafer stack is rotatable within the ring-like reactor by using a motor provided outside the reactor. Heating means is provided so as to surround the reactor body and another heating means is provided at the center of the ring-like reactor. These heating means provides uniform temperature distribution in the horizontal direction within the ring-like reactor. Reaction gas is fed from the bottom end of the ring-like reactor and the reaction gas is outputted from the top end of the ring-like reactor. The gas is fed from the bottom end toward the top end and the gas flow is parallel with each surface of the wafers. The above arrangement of wafers and gas flow affords smooth gas flow and uniform distribution of reactant of the reaction gases. It is also afforded more production rate of wafers in one processing. According to the present invention, a plurality of plasma generating electrodes are arranged at peripheral surface of the reactor and at the central hollow portion of the ring-like reactor. Radio frequency is applied to the electrodes to generate plasma during introduction of etching gas. The plasma etch off any material deposited on an inner surface of the ring-like reactor during the above reaction. When the radio frequency is applied to between the electrodes placed at the peripheral surface, the plasma mainly etch off the materials deposited on the inner surface of the reactor. When the radio frequency is applied to between the peripheral and central portions, the plasma mainly etch off the materials deposited on the surfaces of the wafers. This affords self-cleaning of the reactor which can be large size to conform to wafers having large size.

The above objects and the present invention are then explained in detail by referring to drawings and the preferred embodiments.

DESCRIPTION OF THE PREFERRED EMBODIMENT

At first, prior arts are explained by referring to FIG. 1 to FIG. 4.

Figure 1:
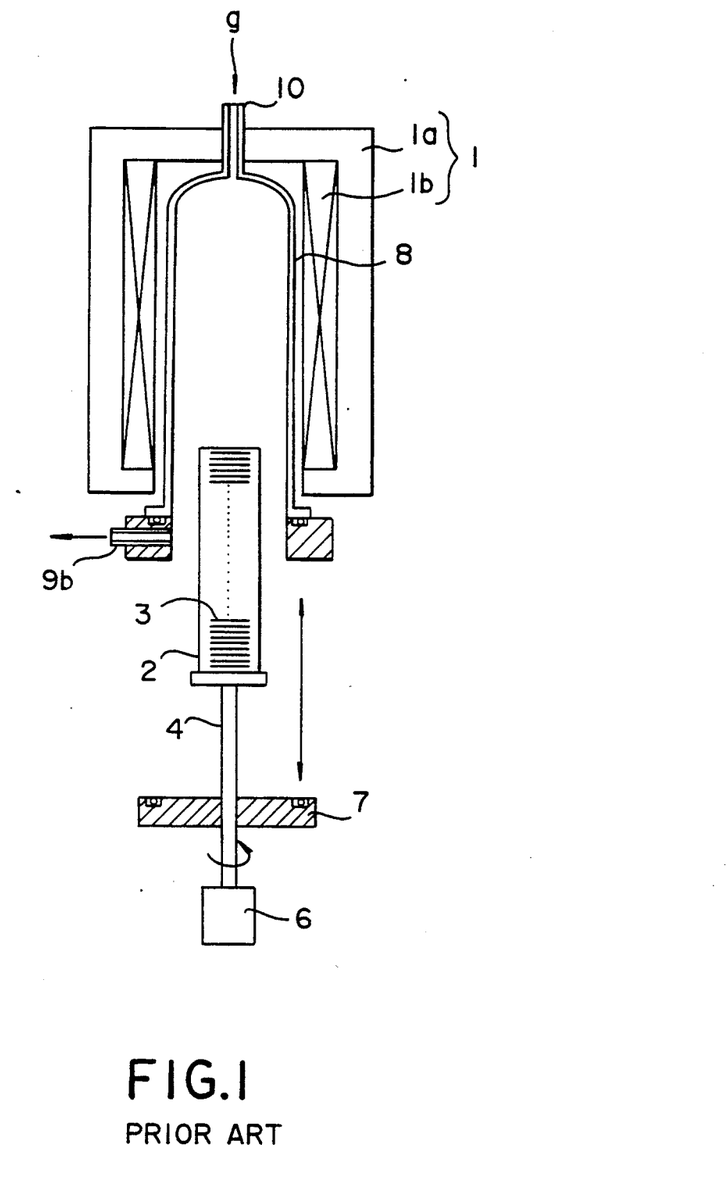
FIG. 1 is a cross-sectional view of a conventional vertical furnace.

FIG. 1 shows a cross-sectional view of a conventional vertical furnace. In this figure, heating means 1 comprising an electric heater 1b and a furnace cover 1a is attached to surround an outer surface of a vertical quartz tube 8. The tube 8 has an inlet 10 at the top of the tube and reaction gas "g" is introduced from the inlet 10. The tube has a lower end which abuts upon a metal susceptor having gas outlet 9b. A plurality of semiconductor wafers 3 are mounted in a wafer holder 2 and the wafer holder 2 is set on a sustaining means 4 which in turn is rotatable by means of a motor 6. A vacuum flange 7 abuts to a lower end of the metal susceptor. The sustaining means 4 and vacuum flange 7 are movable in the vertical direction as illustrated arrows.

During thermal processing, an appropriate gas is introduced from the inlet 10. In a typical example of chemical vapor deposition, some reacted materials are also deposited on the inner surface area of the tube which is near the outlet 9b. The reacted materials are unstable and easily tear off by air stream which can be generated during works of wafer introduction into the tube or wafer drawing back from the tube. The reacted materials flown by the air stream stick to the surfaces of the wafers which results into contamination of wafers. Furthermore, it is necessary to wash out the tube after several processing cycles. Since the tube is large in vertical size, it is troublesome to detach the large tube and to wash the large tube.

Figure 2:
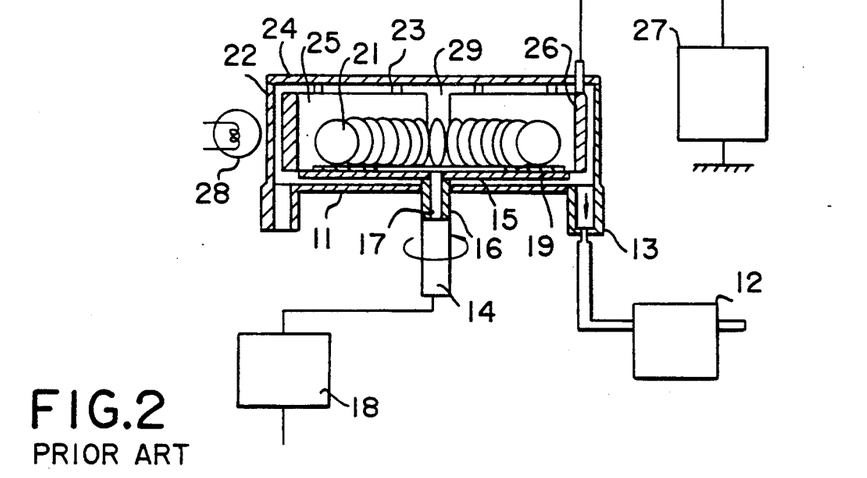
FIG. 2 is a cross-sectional view of a conventional pertinent prior art plasma CVD apparatus disclosed in the above-mentioned Japanese patent publication 59(1984)-145531.
Figure 3:
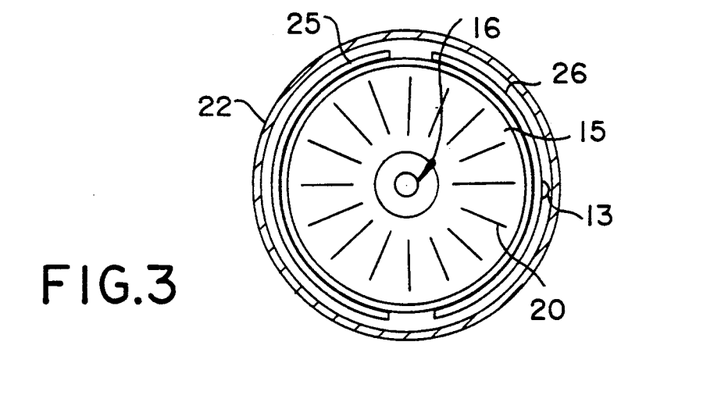
FIG. 3 is a top view of the prior art plasma CVD apparatus.
Figure 4:
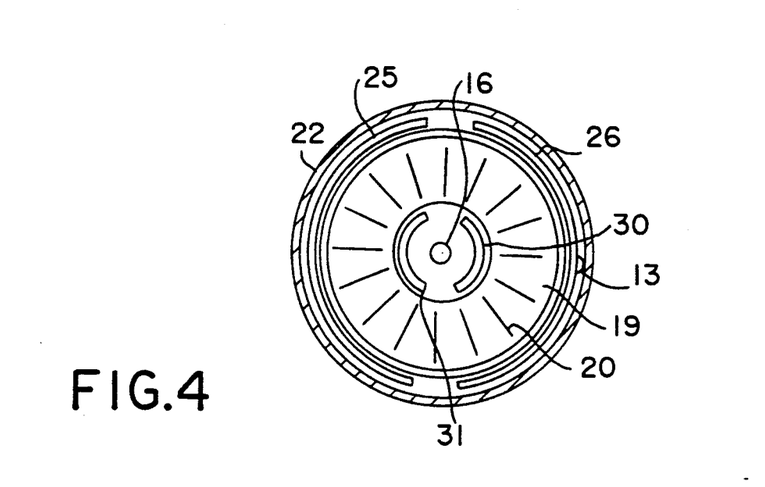
FIG. 4 is a top view of another embodiment of the prior art plasma CVD apparatus.

FIG. 2 shows pertinent prior art plasma CVD apparatus as disclosed in the Japanese patent publication. In FIG. 2, a bell-jar 11 has gas outlet tube 13 which is connected to a vacuum pump 12. In the bottom center portion, a rotation shaft 14 is provided. The rotation shaft 14 is driven by a motor, not shown in this figure. At the top end of the rotation shaft 14, a disc-like susceptor 15 is attached. A gas inlet 16 is provided in the center of the disc susceptor 15. The inlet 16 is connected to a conduit 17 in the tube of the rotation shaft 14. The conduit 17 is connected to a gas controller 18 which controls reaction gases. A doughnut-like ring 19 is placed on the upper surface of the susceptor 15 and the ring 19 has a plurality of trenches 20 as is shown in the top view of FIG. 3. Each wafer 21 is set in the trenches 20 at the peripheral portion thereof. A bell-jar cover 24 is comprised of a cylindrical body 22 and a top cover 23 which are all over the bell-jar body 11. A pair of electrodes 25 and 26 are rigidly fixed to the top cover 23 and are connected to R.F. generator 27. The cylindrical body 22 comprises transparent quartz and a heating lamp 28 is provided outside the cylindrical body 22 in order to heat the wafers 21. FIG. 4 shows another example of the arrangement of plasma generating electrodes 30 and 31 which are inside the wafer ring.

Figure 5:
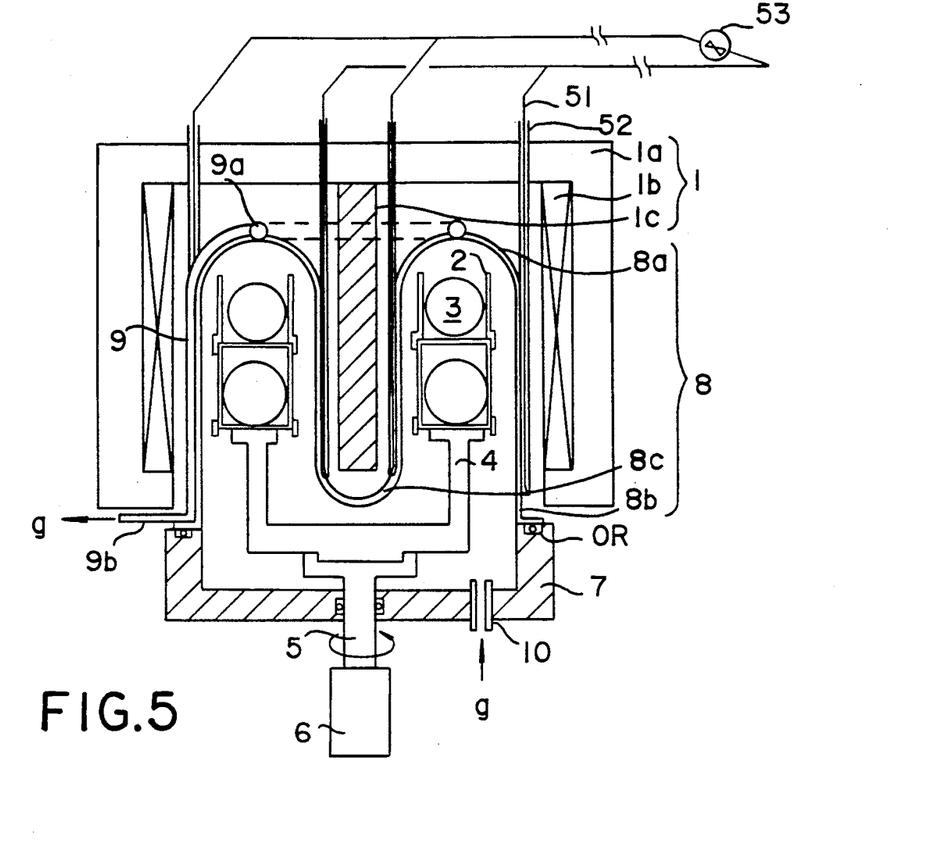
FIG. 5 is a cross-sectional view of an embodiment of a vertical thermal reactor having ring-like reactor body according to the present invention.

FIG. 5 is a cross-sectional view of an embodiment of a vertical thermal reactor having ring-like reactor body in accordance with the present invention. In FIG. 5, the same number as used in FIG. 1 denotes the same object of FIG. 1. 5 denotes a rotation shaft. OR denotes vacuum tight O-ring. 8a is a top ring portion of a ring-like reactor body 8, 8b is an open end of the body 8 and 8c is central recessed portion of the body 8. 1c is a supplemental heat source. An electric heater 1b and the supplemental heat source 1c establish uniform temperature distribution in a longitudinal direction of the body, as is established in the conventional vertical furnace shown in FIG. 1. According to one aspect of the present invention, the vertical thermal reactor 8 is comprised of a ring-like reactor body which means a cylindrical body having a hollow along with its center in order to allow the supplemental heat source 1c to provide therein. In this embodiment of FIG. 5, it is used a quartz reactor having depress at the center as illustrated.

Figure 6:
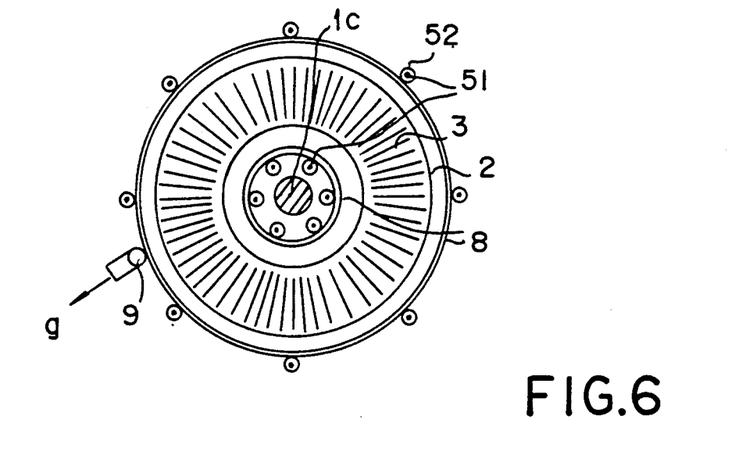
FIG. 6 is a top view of the vertical thermal reactor illustrating mainly a reaction tube and wafers of FIG. 5.

Wafers 3 stand in a ring-like wafer holder 2 and are arranged in a spoke-like fashion as shown in FIG. 6. The wafer holder 2 is mounted on the sustaining means 4 which is connected to the sustaining shaft 5. The wafer holder 2 may have a configuration of so-called flower basket and is of a configuration so as to allow the reaction gas to pass easily therethrough. The wafer holder 2 may have one or more stacks. Two stacks are shown in the embodiment of FIG. 5. As is shown in FIG. 5, the wafer holder 2 is set in the ring-like reaction body 8 and is rotated to improve the reaction uniformity when any processing is carried out. At least one reaction gas is introduced from the inlet 10. In this example, the inlet 10 is placed the bottom plate of the vacuum flange 7 and is directed toward the end 9a of the outlet 9b. When using the outlet 9b is connected to a vacuum system such as a rotary pump and the reaction gas introduced from the inlet 10 provides reactants and the reactants are distributed to all the wafers and finally exhausted from the outlet 9b through the end 9a. It is noted here that a conduit 9 between the end 9a and the outlet 9b is placed in an iso-thermal space provided by a couple of heaters 1b and 1c in order not to deposit any reacted materials. As mentioned before, thermal processing in the vertical reactor includes chemical vapor deposition, chemical vapor etching, gas diffusion and thermal oxidation. As is well known, $SiO_2$, $Si_3N_4$ and other glass film are formed by using silane and other appropriate gas sources. For this, the inlet 10 may be provided more than one. In gas diffusion, a plurality of gas sources are used. Some kind of gases require pre-heating of the gases. When using such kind of gases, the inlet 10 may be placed at the bottom of the recessed portion 8c and a conduit extending from the outside to the inlet 10 placed at the bottom is also placed in the iso-thermal space for pre-heating.

In the embodiment of FIG. 5, the supplemental heat source 1c is provided. The supplemental heat source 1c may be an electric heater or an indirect heater such as a heat absorber which then radiates the heat. The indirect heater may be comprised of a heat reflector. One of these heat source is selected in consideration of design of thermal balance.

The second aspect of the present invention is to arrange a plurality of plasma generating electrodes 51 of the surfaces of the ring-like reactor 8. The plasma generating electrodes 51 is arranged so as to cover the outer cylindrical surface and inner depressed surface. The electrodes 51 are included in insulating tubes 52 and if it is needed, an appropriate inert gas may be filled in the space between the electrodes and the tubes 52. The tubes 52 may be comprised of quartz. A high frequency power source 53 generates radio frequency for generating plasma inside the reactor 8 when an appropriate cleaning gas is introduced into the reactor 8 after several deposition cycles. The cleaning gas is selected from the known gas such as chloride, fluoride in the field of plasma etching.

Figure 7:
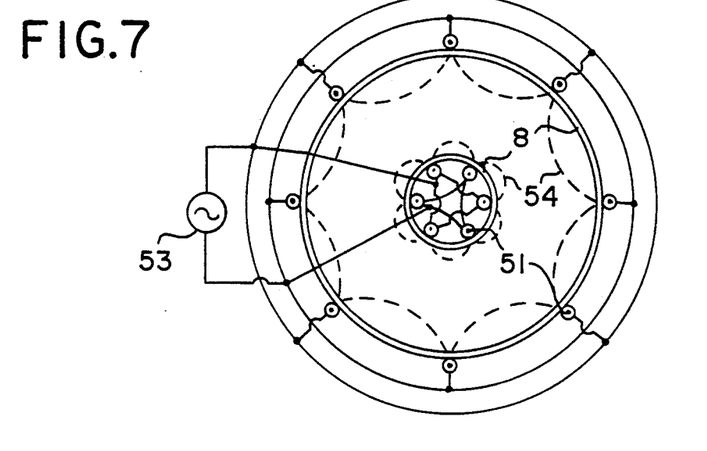
FIG. 7 is a top view of the vertical thermal reactor illustrating self-cleaning by applying R.F. voltage between the adjacent electrodes according to one embodiment of the present invention.
Figure 8:
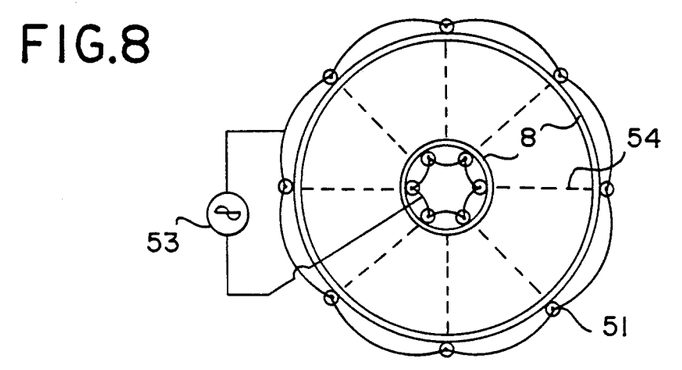
FIG. 8 is a top view of the vertical thermal reactor illustrating wafer cleaning by applying R.F. voltage between outside and inside electrodes.

The electrodes 51 are connected in either manner as illustrated in FIG. 7 and FIG. 8. In FIG. 7, R.F. voltage is applied to between the adjacent electrodes and in this case plasma 54 mainly generates along the inside wall of the reactor thereby cleaning the inside wall without detaching the reactor. Therefore, handling is quite easy. In FIG. 8, R.F. voltage is applied to between the inner electrode and the outer electrode and in this case plasma 54 generates across the inner space of the reactor thereby cleaning the wafers 3 and/or the wafer holder 2. The above mentioned connection of the electrodes may be changable on a console or operation panel and the appropriate connection is selected on the panel for the purpose of the cleaning. The electrodes 51 illustrated in FIG. 7 and FIG. 8 are of rod-like. Plates or mesh can be used as the electrodes 51.

When operating the vertical thermal reactor of the present invention, the same procedure as the conventional vertical reactor is used except for the gas flow as mentioned earlier.

According to the last aspect of the present invention, the reaction gas is introduced from the bottom of the reactor to the top of the reactor and the conduit 9 connecting the top end 9a and the actual outlet 9b is placed in the iso-thermal space. Therefore the unstable deposit never occur at the top end 9a and the conduit 9. The actual outlet 9b is very far from the top end 9a. Consequently, unwanted particles is never deposited on the wafers during the pumping down or the vacuum breaking out. During these works, air stream is strong enough to peel off any reacted materials deposited on the inside wall of the conventional vertical furnace. However, above mentioned problem never arises in accordance with the present invention.

Additionally, the top end 9a may be one opening or more openings. In other case, the top end 9a may have circle configuration.

Figure 9:
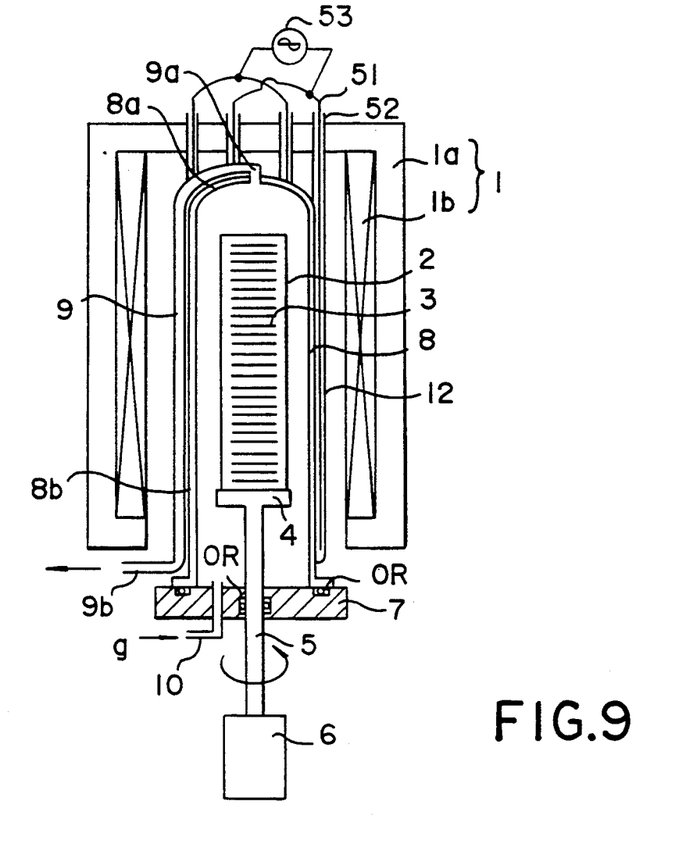
FIG. 9 is a cross-sectional view of vertical reactor according to another embodiment of the present invention.

FIG. 9 is a cross-sectional view of a vertical reactor according to annother embodiment of the present invention. The vertical reactor of FIG. 9 is basically the same structure of the conventional vertical reactor of FIG. 1. The first difference is the configuration of the inlet 10 and the exhausting system comprising the top end 9a and the actual outlet 9b. The purpose and the effect of the arrangement of the conduit in the iso-thermal space was already mentioned. As mentioned earlier, the top portion 8a of the reactor including the top end 9a is in the iso-thermal space of the vertical furnace and the reacted materials has the same uniformity as that deposited on the wafer and the materials deposited on the inner surface arround the top portion 8a has the same adhesiveness. Therefore, peeling off of the deposits is not easy. However, the actual outlet 9b is far from the top end 9a and the temperature arround the outlet 9b is decreased and therefore film characteristic is not uniform and the deposits is easily peeled off. According to the structure of the present invention, the top end 9a is quite far from the actual outlet 9b and is isolated spacially. Therefore, the unstable deposits is never flown on the wafers. The conduit 9 may be fixed to the outer surface of the reactor by fusion of quartz. The above mentioned construction may be equally applied to the holizontal type reactor.

Figure 10:
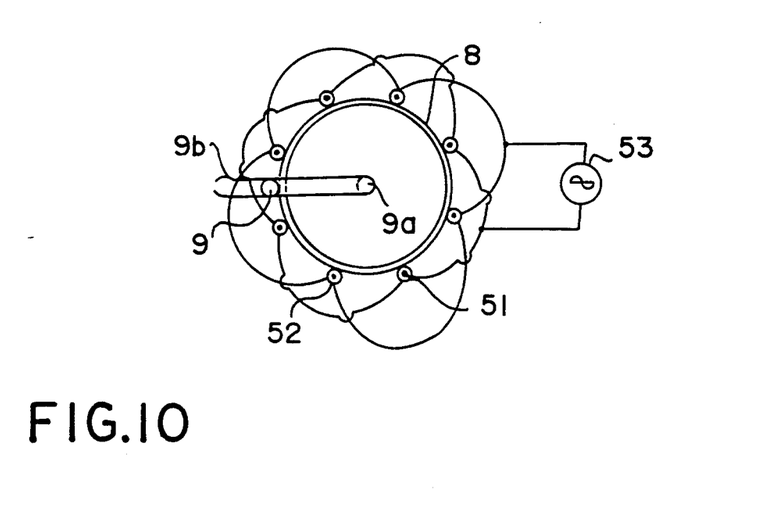
FIG. 10 is a top view of the reactor of FIG. 9.

FIG. 10 is the top view of the reactor of FIG. 9. According to the present invention, plasma generating electrodes 51 are provided. The electrodes 51 are just same as to the electrodes of FIG. 5 through FIG. 8. In FIG. 9 and FIG. 10, R.F. power source is connected between the adjacent electrodes thereby cleaning the inside wall of the reactor. Needless to say, some level of vacuum in the reactor is needed to generate the plasma. If the R.F. power is connected between the opposite electrodes, the plasma is generated within the reactor and in this case, it is possible to clean up the wafers and/or the wafer holder(s).

Figure 11:
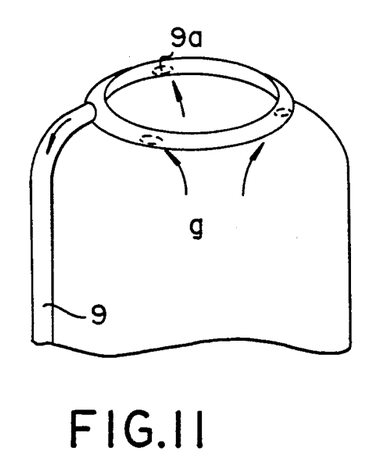
FIG. 11 is a perspective view of the vertical reactor of another embodiment.
Figure 12:
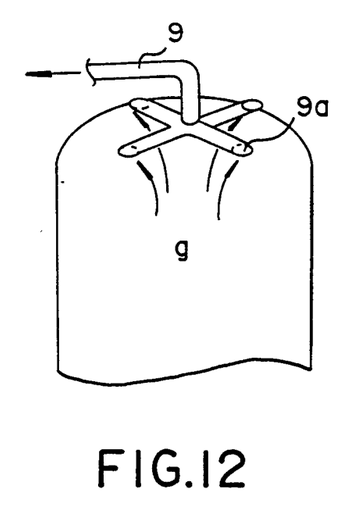
FIG. 12 is a perspective view of the vertical reactor of still another embodiment.

Additionally, the top end 9a may have several configurations in order to establish proper flow of reaction gases. For this purpose, the top end 9a has three or four openings as illustrated in FIG. 11 and FIG. 12. In these figures, arrows show the flow of the reaction gases.

Figure 13:
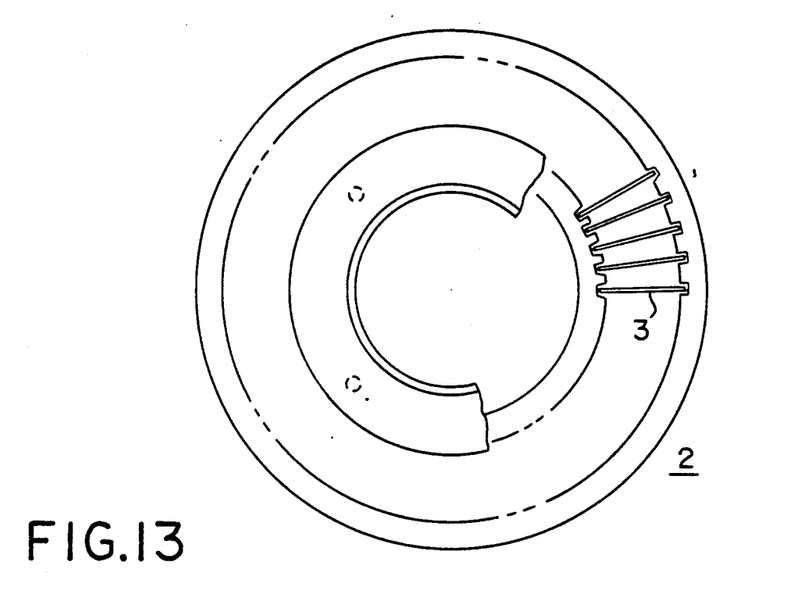
FIG. 13 is a top view of a wafer holder of another embodiment.
Figure 14:
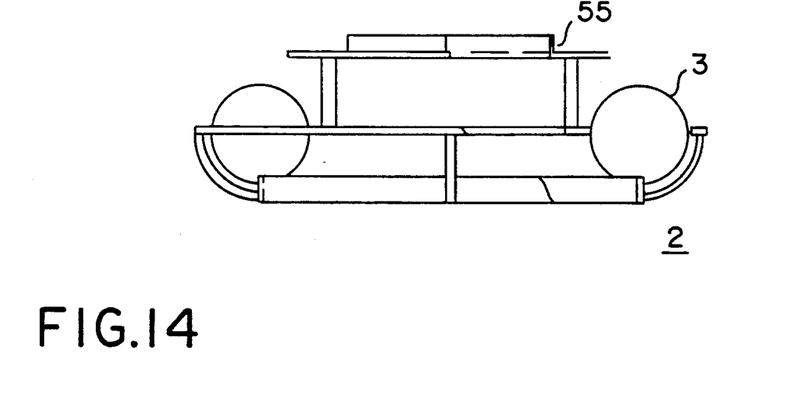
FIG. 14 is a cross-sectional view of the wafer holder of FIG. 13.

FIG. 13 and FIG. 14 show a wafer holder 2 of another embodiment. FIG. 13 is a partial perspective top view of the wafer holder 2 and FIG. 14 is a cross-sectional view of the wafer holder 2 of FIG. 13. The wafer holder 2 consists of quartz and a plurality of wafers 3 are positioned between a pair of quartz ring portions as illustrated in FIG. 13 and FIG. 14. The wafer holder 2 is provided with a top circular quartz flange 55 on which another wafer holder may be stacked in case of processing more wafers in at once.

When handling the wafer holder, a handling means is inserted from central opening of the flange 55 and the wafer holder is then pulled up by hanging up the flange 55.

Figure 15:
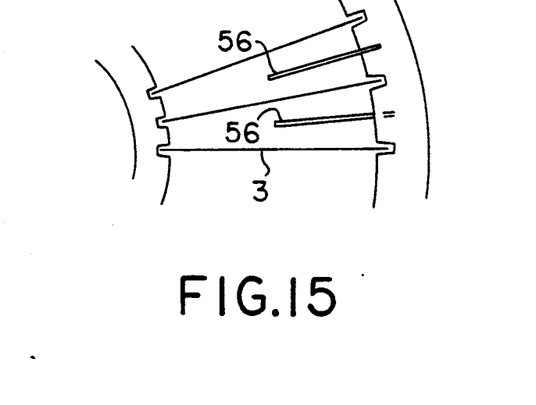
FIG. 15 is a portion of a wafer holder of still another embodiment.
Figure 16:
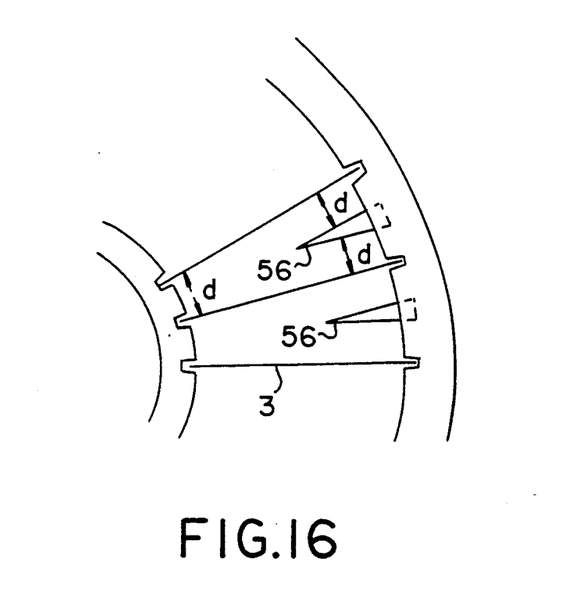
FIG. 16 is a portion of a wafer holder of still another embodiment.

FIG. 15 is a top view of portion of a wafer holder of another embodiment. FIG. 16 shows still another embodiment of the wafer holder. In both figures, a plurality of interposer plates 56 are provided. The wafer holder of FIG. 15 is suitable for the deposition of polycrystalline silicon and silicon nitride, for example. In these reactions, chemical reaction is reaction rate-determining and is not controlled by the distance between the adjacent wafers. However, in the deposition of silicon dioxide, for example, chemical reaction is supply rate-determining and is mainly controlled by the supplied gas volume. In these reactions, wafer spacing is important for uniform deposition or etching and therefore the interposers 56 of FIG. 16 are provided in order to keep the wafer spacing substantially uniform.

In the foregoing, the present invention was explained with reference to the specific examples. However, the present invention is not limited to the above mentioned specific examples and any modification and any change are carried out in accordance with the spirit and concept of the present invention.

What is claimed is:

1. A vertical thermal reactor for processing a plurality of semiconductor wafers therein comprising:

a ring-like reactor body having a cylindrical outer surface portion, said outer portion extending vertically, said reactor body having a depressed portion in the center of the body along with the central axis of the longitudinal direction of the body and thereby defining a ring-like inner space at the cross section of the body, said reactor body having an open bottom end portion and a closed top portion;

means for closing said open bottom end portion;

a gas inlet located in said means for closing for introducing reaction gas into said inner space at the bottom end of the reactor body;

an opening provided on said closed top portion for drawing out said reaction gas from the top of the reactor body, whereby said reaction gas flows upwardly through said inner space toward the top of the reactor body;

a conduit having one end connected to said opening;

an outlet provided at the other end of said conduit for exhausting said drawn out reaction gas from the reactor body, said conduit being positioned along said outer surface portion of the reactor body;

heating means surrounding said outer surface portion of the reactor body for establishing an iso-thermal space within and adjacent said inner space of the body and an additional heating means inserted in said depressed portion of the body, said conduit passing through said iso-thermal space;

a plurality of plasma generating electrodes placed at said outer surface portion and placed in said depressed portion for generating plasma in said inner space whereby cleaning of the inner side wall of said reactor body may be carried out;

a wafer holding means for supporting a plurality of semiconductor wafers, said wafer holding means being positioned in said iso-thermal space in said inner space of the reactor body when thermal processing is carried out;

a sustaining means for supporting said wafer holding means thereon;

a rotatable shaft fixed to said sustaining means for rotating said wafer holding means in said ring-like inner space of the reactor body; and a driving means for rotating said rotatable shaft.

2. The vertical thermal reactor as claimed in claim 1, wherein said wafer holding means includes a plurality of wafer holders stacked upon one another.

3. A vertical thermal reactor for processing a plurality of semiconductor wafers therein comprising:
a cylindrical reactor body having an outer surface portion, said outer portion extending vertically, said reactor body having a hollow in the center of the body along with the central axis of the longitudinal direction of the body and thereby defining a ring-like inner space at the cross section of the body along with said longitudinal direction of the body, said reactor body having an open bottom end portion and a closed top portion;

means for closing said open bottom end portion;

a gas inlet in said means for closing for introducing reaction gas into said inner space at the bottom end of the reactor body;

an opening provided on said closed top portion for drawing out said reaction gas from the top of the reactor body, whereby said reaction gas flows upwardly through said inner space toward the top of the reactor body;

a conduit having an end connected to said opening;

an outlet at the other end of said conduit for exhausting said drawn out reaction gas from the reactor body, said conduit being disposed along said outer surface portion of the reactor body;

heating means surrounding said outer surface of said cylindrical reactor body for establishing an isothermal space within and adjacent said inner space of the body and an additional heating means inserted in said hollow portion of the body, said conduit passing through said isothermal space;

a plurality of plasma generating electrodes placed at said outer surface portion and placed in said hollow portion for generating plasma in said inner space whereby cleaning of an inner side wall of said reactor body may be carried out;

a wafer holding means for supporting a plurality of semiconductor wafers, said wafer holding means being positioned in said iso-thermal space in said inner space of the reactor body when thermal processing is carried out;

a sustaining means for supporting said wafer holding means thereon;

a rotatable shaft fixed to said sustaining means for rotating said wafer holding means in said ring-like inner space of the reactor body; and a driving means for rotating said rotatable shaft.

4. The vertical thermal reactor as claimed in claim 3, wherein said wafer holding means includes a plurality of wafer holders stacked upon one another.

5. A vertical thermal reactor for processing a plurality of semiconductor wafers therein comprising:
a reactor body having a cylindrical outer surface portion, said outer portion being extended vertically and having an open bottom end portion and a closed top portion;

means for closing said open bottom end portion;

a gas inlet located in said means for closing for introducing reaction gas into said inner space at the bottom end of the reactor body;

an opening provided on said closed top portion for drawing out said reaction gas from the top of the reactor body, whereby said reaction gas flows upwardly through said inner space toward the top of the reactor body;

a conduit having one end connected to said opening;

an outlet at the other end of said conduit for exhausting said drawn out reaction gas from the reactor body;

heating means surrounding said outer surface portion of the reactor body for establishing an iso-thermal space within and adjacent said inner space of the body, said conduit passing through said iso-thermal space;

a plurality of plasma generating electrodes placed at said outer surface portion for generating plasma in said inner space whereby cleaning of an inner side wall of said reactor body may be carried out;

a wafer holding means for supporting a plurality of semiconductor wafers, said wafer holding means being positioned in said iso-thermal space in said inner space of the reactor body when thermal processing is carried out;

a sustaining means for supporting said wafer holding means thereon;

a rotatable shaft fixed to said sustaining means for rotating said wafer holding means in said inner space of the reactor body; and a driving means for rotating said rotatable shaft.

* * * * *